(12) United States Patent
Song

(10) Patent No.: US 8,111,561 B2
(45) Date of Patent: Feb. 7, 2012

(54) BULK BIAS VOLTAGE GENERATING DEVICE AND SEMICONDUCTOR MEMORY APPARATUS INCLUDING THE SAME

(75) Inventor: Ho Uk Song, Ichon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 120 days.

(21) Appl. No.: 12/638,120

(22) Filed: Dec. 15, 2009

(65) Prior Publication Data

US 2011/0026333 A1 Feb. 3, 2011

(30) Foreign Application Priority Data

Jul. 30, 2009 (KR) .................. 10-2009-0070116

(51) Int. Cl.
*G11C 5/14* (2006.01)
(52) U.S. Cl. .................. 365/189.09; 365/191; 365/226; 365/227; 365/229

(58) Field of Classification Search ............. 365/189.09, 365/191, 226, 227, 229
See application file for complete search history.

(56) References Cited

U.S. PATENT DOCUMENTS

| | | | |
|---|---|---|---|
| 6,850,453 B2 | 2/2005 | Park | |
| 7,298,664 B2 | 11/2007 | Lee | |
| 7,397,721 B2 | 7/2008 | Lee | |
| 2007/0147159 A1 | 6/2007 | Lee | |
| 2007/0279123 A1* | 12/2007 | Byeon et al. | 327/536 |

FOREIGN PATENT DOCUMENTS

| | | |
|---|---|---|
| KR | 10-1998-075041 | 11/1998 |
| KR | 1020030002421 A | 1/2003 |
| KR | 1020070081030 A | 8/2007 |
| KR | 1020080033017 A | 4/2008 |

* cited by examiner

*Primary Examiner* — Thong Q Le
(74) *Attorney, Agent, or Firm* — William Park & Associates Ltd.

(57) ABSTRACT

A bulk bias voltage generating device is configured to generate a first bulk bias voltage in a deep power down mode and a second bulk bias voltage in a normal mode. The first bulk bias voltage comprises an internal voltage level, and the second bulk bias voltage comprises an external voltage level.

19 Claims, 4 Drawing Sheets

Normal Mode

Deep Power Down Mode

Deep Power Down Mode

Deep Power Down Mode

BULK BIAS VOLTAGE GENERATING DEVICE AND SEMICONDUCTOR MEMORY APPARATUS INCLUDING THE SAME

CROSS-REFERENCES TO RELATED APPLICATION

The present application claims priority under 35 U.S.C 119(a) to Korean Application No. 10-2009-0070116, filed on Jul. 30, 2009 in the Korean Intellectual Property Office, which is incorporated by reference in its entirety as set forth in full.

RELATED ART OF THE INVENTION

1. Technical Field

Embodiments of the present invention relate to a semiconductor memory apparatus, and more particularly, to a bulk bias voltage generating device and the semiconductor memory apparatus including the same.

2. Related Art

In general, a semiconductor memory apparatus is designed so that a bias voltage is applied to a bulk of a MOS transistor constituting the semiconductor memory apparatus. The reason that the bulk bias voltage is applied to the MOS transistor is to prevent latch-up phenomenon and to prevent unstable variations of the threshold voltage of the MOS transistor caused by a body effect. Generally, a low level bias voltage is applied to the bulk in the case of an NMOS transistor, and a high level bias voltage is applied to the bulk in the case of a PMOS transistor. Since an NMOS transistor uses a low level voltage as its source terminal voltage, a low level bias voltage is applied to the bulk to stabilize variation of the threshold voltage. On the other hand, since a PMOS transistor uses a high level voltage as its source terminal voltage, a high level of bulk bias voltage is required.

FIG. 1 is a diagram showing a semiconductor memory apparatus in a normal mode according to the related art. As shown in FIG. 1, the semiconductor memory apparatus includes a PMOS transistor Pm and an NMOS transistor Nm. The semiconductor memory apparatus as shown is an example of a peripheral circuit that uses a peripheral voltage VPERI as its power supply voltage. The peripheral voltage VPERI is an internal voltage used in the peripheral circuit region of the semiconductor memory apparatus, and can have an external voltage VDD level in a normal mode of the semiconductor memory apparatus. The peripheral voltage VPERI changes to a ground voltage VSS level, i.e., 0 V, in a deep power down mode of the semiconductor memory apparatus. As shown in FIG. 1, the bias voltage of the external voltage VDD level is applied to the bulk of the PMOS transistor Pm, and a bias voltage of the ground voltage VSS level is applied to the bulk of the NMOS transistor Nm. In a normal mode of the semiconductor memory apparatus, such a configuration prevents an abrupt variation of the threshold voltage of the MOS transistor. However, in a deep power down mode, such a configuration causes problems. The deep power down mode, which is a stand-by mode of a semiconductor memory apparatus, is an operation mode where power is applied, but power consumption is reduced.

FIGS. 2 and 3 are diagrams showing a semiconductor memory apparatus in the deep power down mode according to the related art. The peripheral voltage VPERI has the ground voltage VSS level in the deep power down mode. Therefore, a voltage having the ground voltage VSS level is applied to a source terminal of the PMOS transistor Pm. If no input signal IN is applied, the ground voltage VSS is applied to the gate terminals of the PMOS transistor Pm and the NMOS transistor Nm, and thus there is no output signal OUT. At this time, a VDD bias voltage of an external voltage level is constantly applied to the bulk of the PMOS transistor Pm. Therefore, as shown in FIG. 3, a junction leakage current occurs in the semiconductor memory apparatus.

As shown in FIG. 3, during the deep power down mode of the semiconductor memory apparatus, the ground voltage VSS is applied to the gate, source, and drain terminals of the PMOS transistor Pm and an external voltage VDD is applied to the N-well region through the bulk. Due to the bulk bias voltage of the external voltage (VDD) level, junction leakage currents occur at the gate, source, and drain terminals of the PMOS transistor Pm.

In the deep power down mode, it is required that power consumption of a semiconductor memory apparatus be reduced. Especially in the case of a semiconductor memory apparatus used for mobile applications having a relatively small power supply, greater reduction of power consumption is needed. However, as mentioned above, it is difficult to prevent a junction leakage current from being generated in the deep power down mode according to the related art.

SUMMARY OF THE INVENTION

Embodiments of the present invention include a bulk bias voltage generating device and a semiconductor memory apparatus including the same, capable of substantially preventing a junction leakage current in the deep power down mode.

In one embodiment of the present invention, a bulk bias voltage generating device is configured to generate a first bulk bias voltage in a deep power down mode and a second bulk bias voltage in a normal mode. The first bulk bias voltage comprises an internal voltage level, and the second bulk bias voltage comprises an external voltage level.

In another embodiment of the present invention, a bulk bias voltage generating device comprises: a node to which a bulk bias voltage is applied; a first voltage generating unit configured to apply a first voltage to the node in response to a deep power down signal; and a second voltage generating unit configured to apply a second voltage to the node in response to the deep power down signal.

In still another embodiment of the present invention, a semiconductor memory apparatus comprises a PMOS transistor configured to use an internal voltage as a source terminal voltage. The semiconductor memory apparatus is configured to apply a first bulk bias voltage to a bulk of the PMOS transistor in a deep power down mode, and to apply a second bulk bias voltage to the bulk of the PMOS transistor in a normal mode. Furthermore, the first bulk bias voltage comprises an internal voltage level, and the second bulk bias voltage comprises an external voltage level.

In still another embodiment of the present invention, a semiconductor memory apparatus comprises: a bulk bias voltage generating unit configured to generate a first bulk bias voltage in a deep power down mode, and to generate a second bulk bias voltage in a normal mode; and a PMOS transistor configured to receive the bulk bias voltage through its bulk. The semiconductor memory apparatus consumes less power in the deep power down mode than in the normal mode. Furthermore, the first bulk bias voltage comprises an internal voltage level and the second bulk bias voltage comprises an external voltage level.

BRIEF DESCRIPTION OF THE DRAWINGS

Features, aspects, and embodiments are described in conjunction with the attached drawings, in which.

DETAILED DESCRIPTION OF THE PREFERRED EMBODIMENTS

Hereinafter, a bulk bias voltage generating device and a semiconductor memory apparatus including the same, according to the present invention, will be described below with reference to the accompanying drawings through preferred embodiments.

Figure 1:
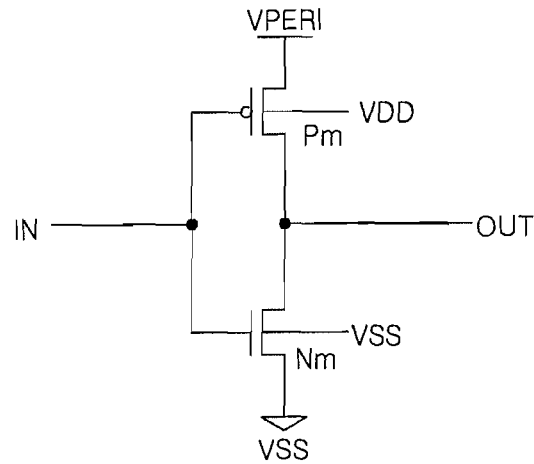
FIG. 1 is a diagram showing a configuration of a semiconductor memory apparatus in a normal mode according to the related art.
Figure 2:
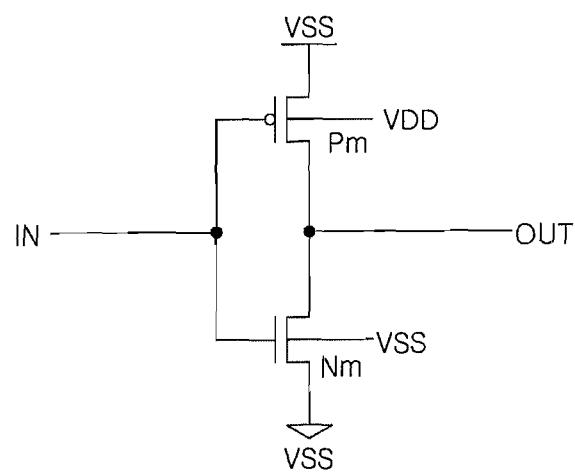
FIG. 2 is a diagram showing a configuration of a semiconductor memory apparatus in the deep power down mode according to the related art.
Figure 3:
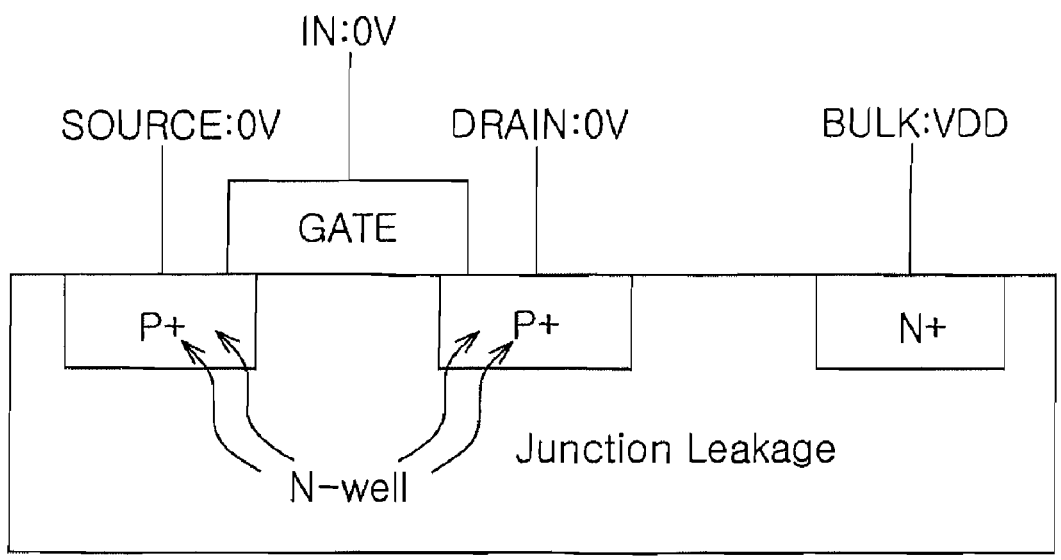
FIG. 3 is a diagram showing a junction leakage current occurrence in the deep power down mode according to the related art.
Figure 4:
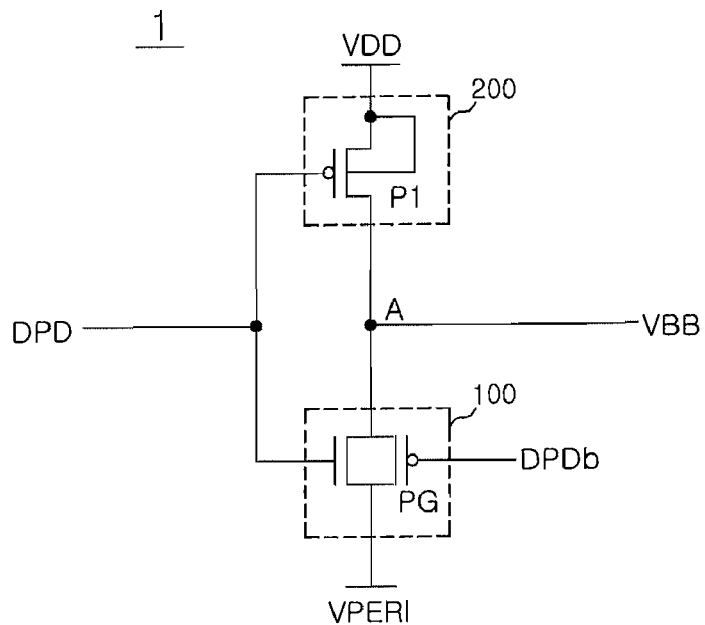
FIG. 4 is a diagram showing a configuration of a bulk bias voltage generating device according to the embodiment of the present invention.

FIG. 4 is a diagram showing a configuration of a bulk bias voltage generating device 1 according to an embodiment. As shown in FIG. 4, the bulk bias voltage generating device 1 according to the embodiment includes node A to which a bulk bias voltage VBB is applied, a first voltage generating unit 100, and a second voltage generating unit 200.

The first voltage generating unit 100 applies the first voltage to node A in the deep power down mode. More specifically, the first voltage generating unit 100 applies a first voltage to node A in response to a deep power down signal DPD. The deep power down signal DPD is a signal that indicates the deep power down mode of a semiconductor memory apparatus and, for example, can be generated by receiving an external command. When the deep power down signal DPD is enabled, the semiconductor memory apparatus enters into the deep power down mode that consumes less power, and exits from the deep power down mode when the deep power down signal DPD is disabled. Hereinafter, all instances when the semiconductor memory apparatus is not in the deep power down mode will be referred to as a normal mode. The first voltage generating unit 100 applies the first voltage to node A when the deep power down signal DPD is enabled, and does not apply the first voltage to node A when the deep power down signal DPD is disabled. The first voltage may be of the ground voltage VSS level in the deep power down mode and has a predetermined positive voltage level in the normal mode.

The first voltage can be one of the internal voltages generated in an internal voltage generating circuit integrated within the semiconductor memory apparatus. When the internal voltage is used in a peripheral circuit region, the internal voltage can be a peripheral voltage VPERI, and when the internal voltage is used in a memory core region, the internal voltage can be a core voltage. However, internal voltages are not limited as such, and thus it should be understood that internal voltages are intended to include all of the internal voltages that are used inside the semiconductor memory apparatus. Hereinafter, internal voltage shall be exemplified by the peripheral voltage VPERI.

The second voltage generating unit 200 applies a second voltage to node A in the normal mode. More specifically, the second voltage generating unit 200 applies the second voltage to node A when the deep power down signal 'DPD' is disabled. In the embodiment, it is preferable that the second voltage is of the external voltage VDD level.

Therefore, according to the embodiment, the bulk bias voltage generating device 1 generates the first voltage level of bulk bias voltage VBB in the deep power down mode, and generates the second voltage level of bulk bias voltage VBB in the normal mode. In other words, the bulk bias voltage generating device 1 generates internal voltage VPERI level of bulk bias voltage VBB when the deep power down signal 'DPD' is enabled, and generates an external voltage VDD level of bulk bias voltage VBB when the deep power down signal 'DPD' is disabled.

As shown in FIG. 4, the first voltage generating unit 100 includes a first pass gate PG. Whether the pass gate PG is turned on or off is controlled based on the deep power down signal DPD and an inverted signal DPDb of the deep power down signal. The first pass gate PG applies the first voltage to node A when the deep power down signal 'DPD' is enabled, and does not apply the first voltage to node A when the deep power down signal 'DPD' is disabled.

The second voltage generating unit 200 includes a first PMOS transistor P1. The first PMOS transistor P1 has a gate terminal configured to receive the deep power down signal DPD, a source terminal configured to receive the external voltage VDD, and a drain terminal coupled to node A. Therefore, when the deep power down signal DPD is disabled, the first PMOS transistor P1 is turned on and can apply the second voltage to node A.

Figure 5:
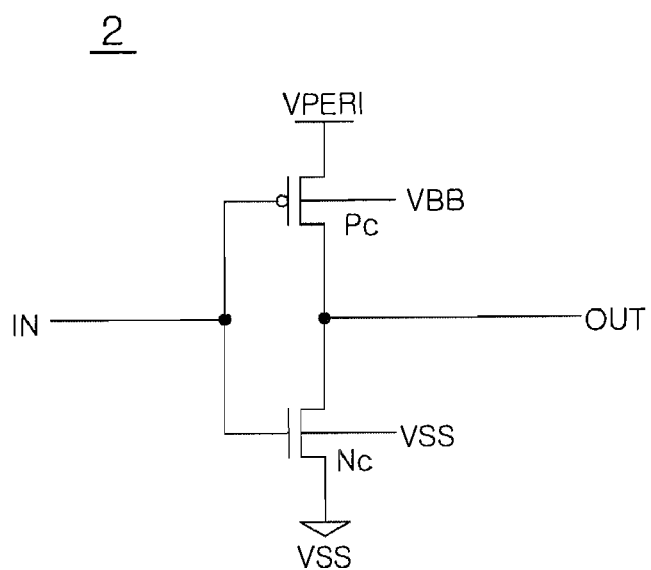
FIG. 5 is a diagram showing a configuration of a semiconductor memory apparatus according to the embodiment.

FIG. 5 is a diagram showing a configuration of a semiconductor memory apparatus 2 according to the embodiment. As shown in FIG. 5, the semiconductor memory apparatus 2 includes a second PMOS transistor Pc and a second NMOS transistor Nc. Specifically, the semiconductor memory apparatus 2 includes a second PMOS transistor Pc that uses internal voltage VPERI as its source terminal voltage. The second PMOS transistor Pc has a gate terminal configured to receive an input signal IN and a source terminal configured to receive internal voltage VPERI. The second PMOS transistor Pc is configured such that the bulk bias voltage VBB generated from the bulk bias voltage generating device 1 is applied to the bulk of the second PMOS transistor Pc. That is, the bulk of the second PMOS transistor Pc receives internal voltage VPERI level of bulk bias voltage VBB in the deep power down mode, and receives external voltage VDD level of bulk bias voltage VBB in the normal mode.

The second NMOS transistor Nc has a gate terminal configured to receive the input signal IN, a source terminal coupled to the ground voltage VSS, and a drain terminal coupled to a drain terminal of the second PMOS transistor Pc. The bulk of the second NMOS transistor Nc receives a ground voltage VSS level bias voltage.

Figure 6:
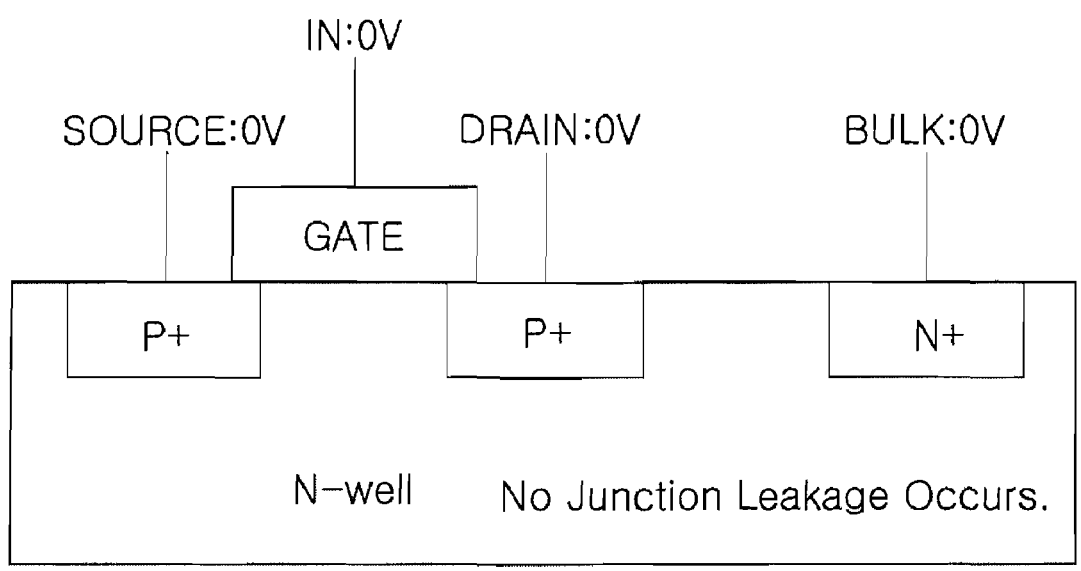
FIG. 6 is a diagram showing a voltage applied to a PMOS transistor of a semiconductor memory apparatus of FIG. 5 in the deep power down mode.

FIG. 6 is a diagram showing a voltage applied to the second PMOS transistor Pc of the semiconductor memory apparatus 2 of FIG. 5 in the deep power down mode. In the deep power down mode, the second PMOS transistor Pc receives internal voltage VPERI level of bulk bias voltage VBB through its bulk. When the semiconductor memory apparatus 2 is in the deep power down mode, internal voltage VPERI is at ground voltage VSS level. In addition, if no input signal IN is applied in the deep power down mode, both the input signal IN and output signal OUT are at ground voltage VSS level. Therefore, as shown in FIG. 6, the gate, source, and drain terminals of the second PMOS transistor Pc receive the ground voltage VSS. At this time, since internal voltage VEPRI level of bulk bias voltage VBB applied to the bulk of the second PMOS transistor Pc, ground voltage VSS is applied to the bulk of the second PMOS transistor Pc. Therefore, since a voltage of the bulk of the second PMOS transistor is at the ground voltage VSS level, no junction leakage current occurs from the N-well region to the gate, source, and drain terminals.

As described above, the embodiment applies variable bulk bias voltage to the bulk of a MOS transistor in the deep power down mode, where power consumption must be reduced, and reduces the junction leakage current that may occur in the MOS transistor.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A bulk bias voltage generating device configured to generate a first bulk bias voltage in a deep power down mode and a second bulk bias voltage in a normal mode,
    wherein the first bulk bias voltage comprises an internal voltage level, and the second bulk bias voltage comprises an external voltage level, and
    wherein, in the deep power down mode, the internal voltage level is a first voltage that is set to one of the power saving voltage levels including a ground voltage level.

2. The bulk bias voltage generating device of claim 1, wherein the internal voltage level is set to a predetermined positive voltage level in the normal mode.

3. The bulk bias voltage generating device of claim 1, wherein the bulk bias voltage is configured to be applied to a bulk of a PMOS transistor.

4. A bulk bias voltage generating device comprising:
    a node to which a bulk bias voltage is applied;
    a first voltage generating unit configured to apply a first voltage to the node in response to a deep power down signal; and
    a second voltage generating unit configured to apply a second voltage to the node in response to the deep power down signal,
    wherein, in the deep power down mode, the first voltage that is set to a ground voltage level or a predetermined voltage level for power saving.

5. The bulk bias voltage generating device of claim 4, wherein the first voltage generating unit is configured to apply the first voltage to the node when the deep power down signal is enabled.

6. The bulk bias voltage generating device of claim 4, wherein the first voltage is configured to be an internal voltage.

7. The bulk bias voltage generating device of claim 6, wherein the internal voltage is set to a predetermined positive voltage level when the deep power down signal is disabled.

8. The bulk bias voltage generating device of claim 4, wherein the second voltage generating unit is configured to apply the second voltage to the node when the deep power down signal is disabled.

9. The bulk bias voltage generating device of claim 8, wherein the second voltage is configured to have an external voltage level.

10. The bulk bias voltage generating device of claim 4, wherein the bulk bias voltage is configured to be applied to a bulk of a PMOS transistor.

11. A semiconductor memory apparatus comprising a PMOS transistor configured to use an internal voltage as a source terminal voltage,
    wherein the semiconductor memory apparatus is configured to apply a first bulk bias voltage to a bulk of the PMOS transistor in a deep power down mode, and to apply a second bulk bias voltage to the bulk of the PMOS transistor in a normal mode,
    wherein the first bulk bias voltage comprises an internal voltage level, and the second bulk bias voltage comprises an external voltage level, and
    wherein, in the deep power down mode, the internal voltage level is a first voltage that is set to one of the power saving voltage levels including a ground voltage level.

12. The semiconductor memory apparatus of claim 11, wherein the internal voltage is set to a predetermined positive voltage level in the normal mode.

13. The semiconductor memory apparatus of claim 11, wherein the semiconductor memory apparatus further includes a bulk bias voltage generating unit configured to selectively provide the internal voltage and the external voltage as the bulk bias voltage in response to a deep power down signal.

14. The semiconductor memory apparatus of claim 11, wherein the semiconductor memory apparatus further includes an NMOS transistor configured to receive a ground voltage through its bulk.

15. A semiconductor memory apparatus comprising:
    a bulk bias voltage generating unit configured to generate a first bulk bias voltage in a deep power down mode, and to generate a second bulk bias voltage in a normal mode; and
    a PMOS transistor configured to receive the bulk bias voltage through its bulk;
    wherein the semiconductor memory apparatus consumes less power in the deep power down mode than in the normal mode,
    wherein the first bulk bias voltage comprises an internal voltage level and the second bulk bias voltage comprises an external voltage level, and
    wherein, in the deep power down mode, the internal voltage level is a first voltage that is set to one of the power saving voltage levels including a ground voltage level.

16. The semiconductor memory apparatus of claim 15, wherein the internal voltage is set to a predetermined positive voltage level in the normal mode.

17. The semiconductor memory apparatus of claim 16, wherein the bulk bias voltage generating unit includes:
    a node to which a bulk bias voltage is applied;
    a first voltage generating unit configured to apply the internal voltage to the node in response to a deep power down signal; and
    a second voltage generating unit configured to apply the external voltage to the node in response to the deep power down signal.

18. The semiconductor memory apparatus of claim 15, wherein the PMOS transistor is configured to use, the internal voltage as a source terminal voltage.

19. The semiconductor memory apparatus of claim 15, wherein the semiconductor memory apparatus further includes an NMOS transistor configured to receive a ground voltage through its bulk.

* * * * *